United States Patent [19]

Janszen

[11] 3,931,867

[45] Jan. 13, 1976

[54] WIDE RANGE SPEAKER SYSTEM

[75] Inventor: Arthur A. Janszen, Belmont, Mass.

[73] Assignee: Electrostatic Research Corporation, Beverly, Mass.

[22] Filed: Feb. 12, 1975

[21] Appl. No.: 549,393

[52] U.S. Cl. ................ 181/155; 181/144; 181/148; 181/153; 179/1 E

[51] Int. Cl.$^2$ ............................................ H05K 5/00

[58] Field of Search ............................ 181/144–155, 181/141; 179/1 E, 1 GA

[56] References Cited

UNITED STATES PATENTS

| | | | |
|---|---|---|---|
| 2,065,367 | 12/1936 | Evans | 181/144 |
| 3,054,856 | 9/1962 | Arany | 181/147 |
| 3,670,842 | 6/1972 | Ekdahl et al. | 179/1 E |
| 3,818,138 | 6/1974 | Sperrazza, Jr. | 179/1 E |

*Primary Examiner*—Stephen J. Tomsky
*Attorney, Agent, or Firm*—Kenway & Jenney

[57] ABSTRACT

In the speaker system disclosed herein, the magnet supporting basket of a downwardly-facing, acoustic-suspension woofer supports a bell-shaped diffuser which circumferentially disperses midrange acoustic components radiated from the back side of the speaker cone. A cylindrical array of tweeter elements are mounted on a rim on the diffuser, above its reflective surface.

8 Claims, 2 Drawing Figures

WIDE RANGE SPEAKER SYSTEM

BACKGROUND OF THE INVENTION

This invention relates to high fidelity loudspeaker systems and more particularly to a wide range speaker system having omnidirectional characteristics.

While various speaker systems have been proposed heretofore for the purpose of achieving omnidirectional characteristics, the configuration of the present invention is believed to provide a particularly advantageous arrangement whereby the various components of such a system may be advantageously assembled into a cohesive structure which provides exceptional fidelity of reproduction and truly omnidirectional radiation characteristics in the azimuth plane in a structure having an inherently pleasing and utilitarian appearance. Furthermore, the arrangement results in an inherently simple and direct method and sequence of assembly providing support for the various components.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
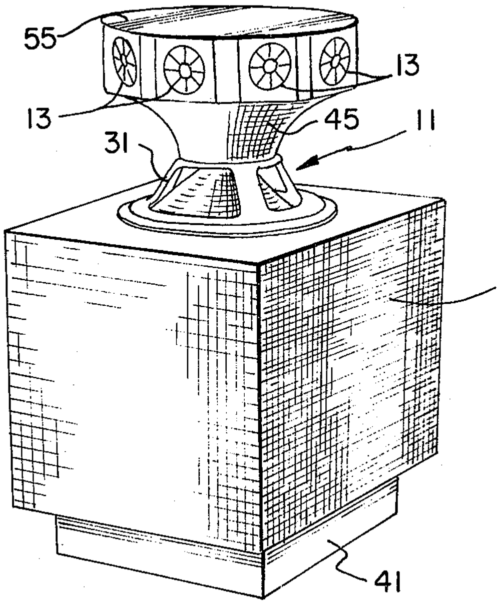
FIG. 1 is a perspective view of a complete speaker system constructed in accordance with the present invention.

Referring now to the drawings, it may be noted at the outset that the speaker system illustrated there employs a cone-type woofer 11 and a plurality of tweeters 13. The woofer 11 is operated in an acoustic suspension mode as described in greater detail hereinafter. The term woofer is used herein to distinguish from relatively high frequency radiating elements, such as tweeters, but is not intended to limit the speaker 11 to a radiator operating only in the lower audio ranges. Rather, the term is intended to include a conetype speaker which radiates relatively efficiently in what may be considered to be the mid-range of the audio spectrum.

Figure 2:
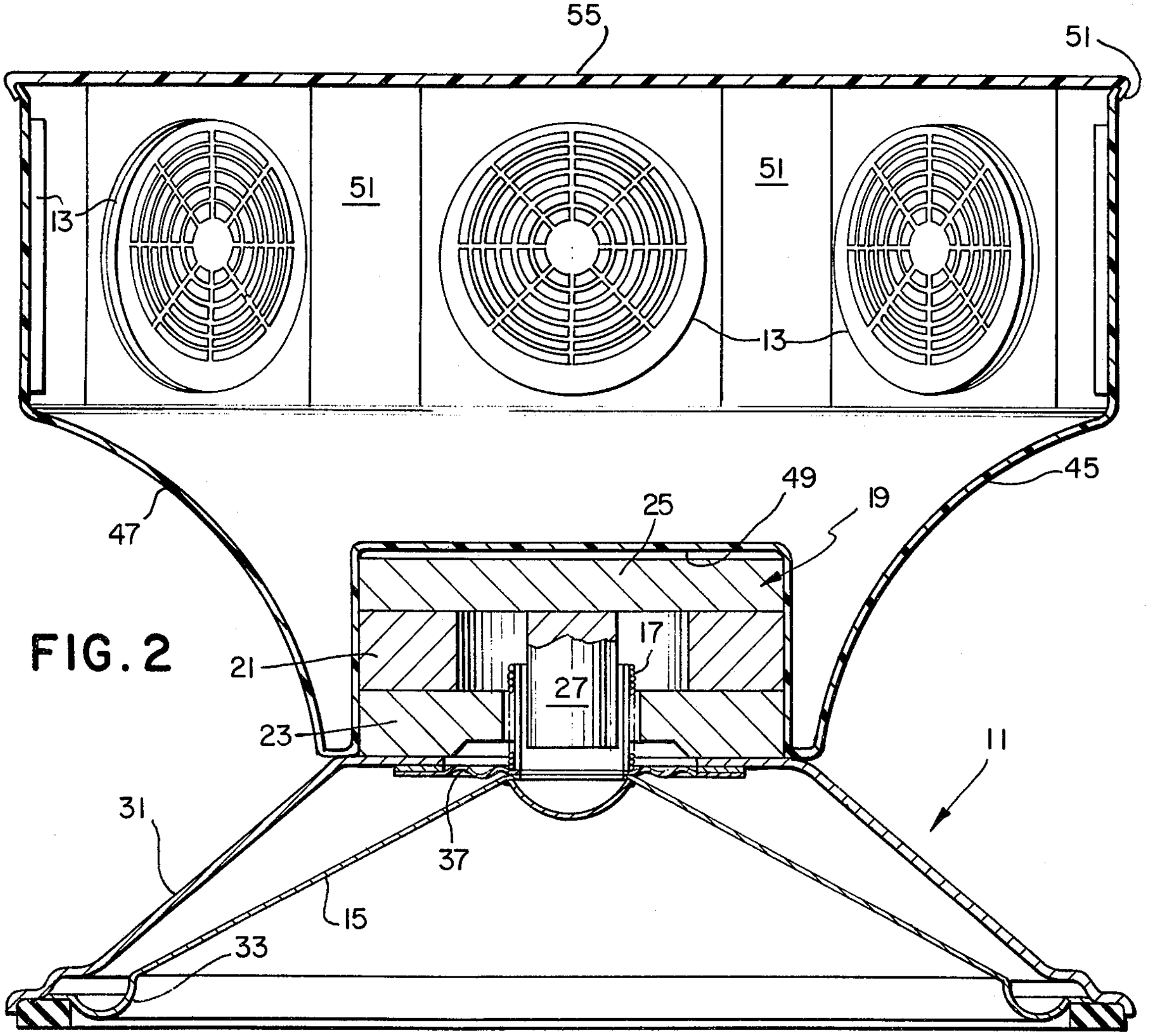
FIG. 2 is a sectional view through the upper portion of the speaker system of FIG. 1 showing the construction and preferred assembly of the various components of the system.

As may be seen in FIG. 2, the woofer 11 is itself of essentially conventional construction, having a cone 15 to which is attached a cylindrical voice coil 17. Voice coil 17 operates in a radial magnetic polarizing field provided by a magnet structure which is designated generally by reference character 19. The magnetic structure 19 includes a ring magnet 21, a centrally apertured front plate 23 and a back plate 25. A central post 27 is mounted in the center of back plate 25 and extends into the central aperture of the front plate 23 so as to form therewith a cylindrical magnetic gap which accommodates the voice coil 17. The magnetic structure 19 is supported in relation to the cone 15 and voice coil 17 by means of a relatively open metal basket 31. The periphery of cone 15 is flexibly connected to the periphery of the basket by a rolling surround 33. A resilient spider 37 is also provided for keeping the voice coils 17 centered in the gap of the magnetic structure 19.

The woofer 11 is, as noted previously, operated in an acoustic suspension mode, i.e. the speaker is mounted in an opening in an acoustically sealed chamber so that the air within the chamber provides a substantial portion of the dynamic restoring force for the cone 15. As opposed to the usual arrangement, however, where the basket and cone extend into the chamber from the chamber opening, the arrangement of the present invention provides that the basket and cone extend outwardly from the opening. Further, the opening is on top of the acoustic suspension chamber, rather than extending through a sidewall thereof, and the chamber provides a base for the overall speaker system. In the embodiment illustrated, the chamber is formed by a box-like structure 39 which provides the support for most of the other components of the overall speaker system. As is conventional, the box-like structure 39 may be largely filled with acoustic fiberglass to provide suitable damping. For appearance purposes, a recessed base may be provided as indicated at 41.

As will be understood by those skilled in the art, movement of the cone 15 at audio frequencies can cause radiation from both the front face and the back surface of the cone. As the dimensions of the speaker system will typically be small as compared with the wavelengths of acoustic waves over the lower audio frequency range, e.g. 20 to 200 cycles per second, the orientation of the mounted speaker cone makes virtually no difference over this range. Rather, this radiation is inherently omnidirectional. In order to provide circumferential distribution of mid-range acoustic energy radiated from the cone 15, however, the present invention provides a diffuser 45 which is supported above the speaker cone 15. In the preferred embodiment illustrated, the diffuser is mounted on the magnetic structure 19 so as to be supported by the basket 31. The diffuser 45 comprises a reflecting surface 47 located above the cone 15 around the magnetic structure 19, which surface is generally in the form of an inverted bell curving radially outwardly as it rises. This shape forms a surface which will distribute mid-range acoustic energy radiated from the back side of the cone 15 in a relatively uniform horizontal distribution, circumferentially around the speaker system. In the drawing, the diameter of the bell has been compressed somewhat to fit the space. With a ten-inch speaker, a bell-shape opening out to about thirteen inches is appropriate.

In the preferred embodiment illustrated, the diffuser 45 is a vacuum molded plastic part which comprises, in addition to the reflecting surface 47, a cavity 49 which fits closely over the magnetic structure 19, and a multi-faceted, generally cylindrical rim 51. Rim 51 extends vertically from the periphery of the reflecting surface 47 and serves as a mount or support for the tweeters 13. The tweeters 13 are arranged in a circular array and, in the preferred embodiment illustrated, are electrostatic radiators constructed generally as disclosed in my U.S. Pat. No. 3,800,102. In order to provide a quite uniform omnidirectional distribution of high frequency energy, eight such tweeter elements are employed, these elements being disposed in a circular array around the rim 51. Preferably, a top plate 55 of a plastic material matching the diffuser molding 45 is mounted, e.g. by being adhesively secured in place, across the open top of the vacuum formed plastic diffuser so as to provide a pleasing appearance. If a separate, upper midrange speaker is desired in addition to the midrange capability of the speaker 11, such an additional speaker may be mounted on the plate 55, preferably aimed upwardly.

The space within the diffuser molding may conveniently be used for electronic components such as the crossover network typically used to divide the audio output of a power amplifier between the woofer 11 and the tweeters 13 and/or a self-energizing circuit such as a voltage multiplier for polarizing the tweeter elements if they are of the preferred electrostatic type.

Summarizing, it can be seen that the configuration of the present invention not only provides for an effective omnidirectional distribution of acoustic energy in the various frequency ranges of interest, but also provides a structure in which the various operative components may be mounted one upon the other in an efficient sequence and in which the final assembly yields an overall pleasing appearance. Further, the assembly can be of relatively low cost, requiring very few special components or elements.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A wide range speaker system comprising:

a base member defining an air chamber which is acoustically sealed except for an upwardly facing opening;

mounted over said opening, a cone type woofer having a downwardly facing cone with attached cylindrical voice coil, a magnetic structure forming a cylindrical magnetic gap providing a radial polarizing field for said voice coil and a relatively open basket structure extending upwardly from said opening for supporting said magnetic structure, said cone being flexibly connected to said basket structure around the periphery of said cone;

supported by said basket structure, diffuser means providing a reflecting surface for midrange acoustic components radiated from the back side of said cone, said surface being generally in the shape of an inverted cone which curves outwardly in radial section as it rises from said woofer; and a circular array of outwardly facing tweeter elements mounted around the periphery of said diffuser just above said reflecting surface.

2. A speaker system as set forth in claim 1 wherein said tweeter elements are electrostatic radiators.

3. A speaker system as set forth in claim 1 wherein said base member is essentially box-like in configuration and contains acoustic fiberglass damping material.

4. A speaker system as set forth in claim 1 wherein said diffuser means comprises a central cavity which fits closely over said magnet structure so that the diffuser means and said tweeter elements are supported by said basket structure through said magnetic structure.

5. A speaker system as set forth in claim 4 wherein said diffuser means is a plastic part comprising, in addition to said reflecting surface, a central cavity for receiving the woofer magnetic structure and an annular rim around the periphery of said reflecting surface.

6. A speaker system as set forth in claim 5 wherein said diffuser is a vacuum molded plastic part.

7. A speaker system as set forth in claim 5 further including a flat disk-like cover bridging the diffuser across said rim.

8. A wide range speaker system comprising:

a box-like base member defining an air chamber which is acoustically sealed except for an upwardly facing circular opening;

mounted over said opening, a cone type woofer having a downwardly facing cone with attached cylindrical voice coil, a generally cylindrical magnetic structure forming a circular magnetic gap providing a radial polarizing field for said voice coil and a relatively open basket structure extending upwardly from said opening for supporting said magnetic structure, said cone being flexibly connected to said basket structure around the periphery of said cone;

above said woofer, diffuser means providing a reflecting surface for midrange acoustic components radiated from the back side of said cone, said surface being generally in the shape of an inverted cone which curves outwardly in radial section as it rises from said woofer, said diffuser means comprising a vacuum molded plastic part providing, in addition to said reflecting surface, a central cavity for receiving said magnetic structure and a rim extending upwardly from the periphery of said reflecting surface; and mounted in respective apertures in said rim, a circular array of outwardly facing electrostatic radiators mounted around the periphery of said diffuser.

* * * * *